United States Patent

Takahashi

[11] Patent Number: 6,030,749
[45] Date of Patent: *Feb. 29, 2000

[54] PHOTOSENSITIVE RESIN COMPOSITION AND A PHOTOSENSITIVE ELEMENT STRUCTURE

[75] Inventor: Katsuhiro Takahashi, Fuji, Japan

[73] Assignee: Asahi Kasei Kogyo Kabushiki Kaisha, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 07/842,186
[22] PCT Filed: Nov. 19, 1991
[86] PCT No.: PCT/JP91/01588
§ 371 Date: Mar. 20, 1992
§ 102(e) Date: Mar. 20, 1992
[87] PCT Pub. No.: WO92/09011
PCT Pub. Date: May 29, 1992

[30] Foreign Application Priority Data

Nov. 19, 1990 [JP] Japan ................................ 2-311581

[51] Int. Cl.⁷ .............................. G03C 1/76; G03F 7/105; G03F 7/11
[52] U.S. Cl. ................................... 430/273.1; 430/281.1; 430/286.1; 430/287.1; 430/292; 430/338; 430/346; 430/923; 522/78
[58] Field of Search ................................ 430/281, 284, 430/285, 287, 292, 306, 906, 908, 910, 915, 916, 919, 920, 923, 332, 334, 338, 339, 340, 346, 273, 286.1, 273.1, 281.1, 284.1, 285.1, 287.1, 309, 327, 328; 522/14, 39, 78, 48

[56] References Cited

U.S. PATENT DOCUMENTS

| | | | |
|---|---|---|---|
| 3,954,468 | 5/1976 | Lewis et al. | |
| 4,251,619 | 2/1981 | Kurita | 430/292 |
| 4,427,759 | 1/1984 | Gruetzmacher et al. | 430/273.1 |
| 4,460,675 | 7/1984 | Gruetzmacher et al. | 430/300 |
| 4,582,862 | 4/1986 | Berner et al. | 522/14 |
| 4,619,885 | 10/1986 | Wingen et al. | 430/288.1 |
| 4,659,649 | 4/1987 | Dickinson et al. | 430/292 |
| 4,702,997 | 10/1987 | Ai et al. | 430/284.1 |
| 4,857,438 | 8/1989 | Loerzer et al. | 430/332 |
| 4,886,735 | 12/1989 | Boettcher et al. | 430/332 |
| 4,942,111 | 7/1990 | Wade et al. | 430/273.1 |
| 4,946,758 | 8/1990 | Kurtz et al. | 430/273.1 |
| 5,006,447 | 4/1991 | Umeda et al. | 430/273.1 |
| 5,302,627 | 4/1994 | Field et al. | 522/75 |

FOREIGN PATENT DOCUMENTS

| | | |
|---|---|---|
| 0239868 | 10/1987 | European Pat. Off. . |
| 58-125042 | 7/1983 | Japan . |
| 61-188534 | 8/1986 | Japan . |
| 62-229127 | 10/1987 | Japan . |
| 62-287234 | 12/1987 | Japan . |
| 63-174037 | 7/1988 | Japan . |
| 63-180942 | 7/1988 | Japan ............................ 430/340 |
| 1-118833 | 5/1989 | Japan . |
| 1-185314 | 7/1989 | Japan . |

OTHER PUBLICATIONS

Derwent Abstract Acc–No 1989–253387 of JP 01–185314 (Pub Jul. 1989).

E.M. Kuprina, Derwent Publications Ltd. Abstract No. 80–30675C.

"Senryo Bin–ran (Dye Handbook)," *New Edition Dye Handbook*, p. 868, Jul. 20, 1970.

*McGraw–Hill Dictionary of Scientific and Technical Terms*, 2nd Ed., 1978, p. 1205.

*Primary Examiner*—Janis L. Dote
*Attorney, Agent, or Firm*—Birch, Stewart, Kolasch & Birch, LLP

[57] ABSTRACT

A photosensitive resin composition comprising (A) a binder polymer and/or a prepolymer; (B) an ethylenically unsaturated compound; (C) a radical producer capable of producing a free radical upon exposure to an ultraviolet ray of 300 to 400 nm; and (D) an anthraquinone dye capable of exhibiting a color change upon exposure to an ultraviolet ray having a wavelength in the range of 300 to 400 nm in the presence of the radical producer (C). This photosensitive resin composition, upon exposure through a negative mask to an ultraviolet ray of a wavelength in a specific range and of a quantity larger than a threshold value, can form a photoresin product having image and non-image portions which are different in color from each other, and, hence, this composition can advantageously be used in the fields of printing plates and resists. Especially when this composition is used in the production of a flexographic printing plate, image relief and non-image portions which are different in color are formed, thereby enabling production of a flexographic printing plate which has a good contrast between the relief and non-image portions and therefore is greatly improved in working efficiency and accuracy for positioning when the printing plate is mounted onto the cylinder of a printing machine, as compared to the conventional printing plate comprising relief and non-image portions both having substantially the same color.

6 Claims, No Drawings

PHOTOSENSITIVE RESIN COMPOSITION AND A PHOTOSENSITIVE ELEMENT STRUCTURE

TECHNICAL FIELD

The present invention relates to a photosensitive resin composition and a photosensitive element structure comprising the photosensitive resin composition. More particularly, the present invention is concerned with a photosensitive resin composition containing an anthraquinone dye capable of exhibiting a color change to produce a fresh color upon being irradiated with an ultraviolet ray of a wavelength in a specific range and of a quantity larger than a threshold value in the presence of a radical producer, and a photosensitive element structure comprising the composition. The photosensitive resin composition of the present invention is capable of exhibiting a color change to produce a fresh color upon being irradiated with an ultraviolet ray of a wavelength in a specific range which ray is irradiated in a quantity of larger than a threshold value in order to form an image and, hence, can advantageously be used for producing a photocured resin product, such as a printing plate and a resist, in which an image portion corresponding to an imagewise-exposed portion has a color which is different from the color of a non-image portion corresponding to an unexposed portion. For example, in a printing plate produced from the photosensitive resin composition of the present invention, the relief portion (image portion) has a color which is different from the color of the non-image portion, to thereby provide a good contrast between the image portion and the non-image portion. Therefore, especially, the photosensitive resin composition of the present invention can advantageously be used for obtaining a flexographic printing plate which is greatly improved in working efficiency and accuracy for positioning, when the printing plate is mounted onto the cylinder of a printing machine.

BACKGROUND ART

Conventionally, a rubber plate for use in flexographic printing has been produced by etching a metallic plate to produce an original plate, preparing a matrix plate from, e.g., a plastic by using the original plate, and pouring a rubber into the matrix plate, followed by pressing. However, this method has drawbacks in that numerous steps are needed, thus requiring too great a cost and too much time. In addition, this method also has drawbacks in that the produced rubber plate itself is low in thickness precision and, hence, it is necessary to raise the thickness precision by shaving the back side of the plate before use.

In order to solve this problem, there has recently been proposed a method of producing a flexographic printing plate directly from a photosensitive resin composition. According to this method, not only can the step for the above-mentioned shaving of the back side of the plate be eliminated, but also it is possible to obtain a printing plate capable of printing a pattern which is fine, as compared to a pattern which can be printed by the conventional rubber plate.

The production of a printing plate from such a photosensitive resin composition is performed by irradiating a photosensitive resin composition with actinic rays through a negative mask having a predetermined transparent pattern to thereby photocure only the resin portion exposed to rays in accordance with the transparent pattern, and then washing out the non-exposed portion with a developer, thereby forming a "relief portion" corresponding to the exposed portion and a "non-image portion" corresponding to the non-exposed portion. The thus formed relief portion is utilized as a relief of a printing plate.

A printing plate produced from a photosensitive resin composition, which plate is used in multicolor printing in many cases, has a disadvantage in that since the relief is transparent, the relief surface is difficult to distinguish, so that it is difficult to properly position a printing plate each time a printing plate is mounted onto the cylinder of a printing machine for printing an individual color.

As a method for alleviating this drawback, it is conceivable to simply color the photosensitive resin composition. By this method, there can be produced a difference in color strength between the relief portion and the non-image portion due to the difference in thickness therebetween. However, this method has drawbacks in that the color of the relief portion is essentially the same as the color of the non-image portion, so that only little effect can be attained with respect to the improvement of working efficiency and accuracy for positioning when the printing plate is mounted onto the cylinder of a printing machine. Thus, for greatly improving working efficiency and accuracy for positioning in fitting the printing plate to the cylinder of a printing machine, it is desired to provide a difference in color between the relief surface and the non-image portion. As a method for obtaining such a printing plate having different colors, reference is made to, for example, Japanese Patent Application Laid-Open Specification No. 58-125042, in which it is described that a mass of a photosensitive resin composition is inserted between a substrate and a multilayer cover element comprised of a cover film, a solvent-soluble polymer film and a photosensitive elastomeric composition containing a non-migratory dye having a contrasting color, and then subjected to calendering to thereby prepare a photosensitive structure, from which there can be obtained a printing plate having a relief surface portion (comprising a photocured elastomeric composition layer containing the non-migratory dye) having a color which is different from the color of. the lower portion. However, this method has a drawback in that the photocured elastomeric composition layer containing the non-migratory dye is likely to come off at its lower portion at the time of development, resulting in the formation of undesired bumps and dents on the relief surface. Thus, it is difficult to practically use the printing plate produced by this method.

On the other hand, Japanese Patent Application Laid-Open Specification No. 62-229127 describes a structure prepared by disposing a dyed layer comprising a photo-discolorable dye and a binder polymer on a photosensitive layer. In the above-mentioned structure, the provision of the dyed layer is intended to cause a portion of the dyed layer, which corresponds to an image portion, to discolor upon exposure, thereby facilitating the cutting of a non-image portion which is to be conducted before development. The selection of an appropriate type of dye makes it possible for the discolored dyed layer to resume its original color after development and drying. This prior art reference contains a description that a portion of the dyed layer which corresponds to the non-image portion does not undergo discoloration and, hence, remains low in light transmission, thereby being less affected by scattered light or the like, while a portion of the dyed layer which corresponds to the image portion is caused to be high in light transmission due to discoloration, thereby enabling formation of an image of high fidelity to the original image in the photosensitive layer. However, in this prior art, during the storage of an uncured plate after the preparation thereof before the actual use thereof for being exposed, the dye is likely to migrate from the dyed layer to the photosensitive resin composition, so that in a photocured plate produced therefrom both of the relief surface and the non-image portion are colored with the dye. Thus, a satisfactory contrast cannot be obtained between the relief portion and the non-image portion.

Further, Japanese Patent Application Laid-Open Specification No. 62-287234 describes a photosensitive resin layer obtained by uniformly incorporating a dye, which can discolor upon exposure to actinic radiation of ultraviolet or visible region and which can resume its original color upon development, into a composition comprising a polymer having rubber-like elasticity, an addition-polymerizable unsaturated monomer and a photopolymerization initiator. However, also in this case, the ultimate plate has its entire portion colored with the same color, so that a satisfactory contrast cannot be obtained between the relief portion and the non-image portion.

In this situation, the present inventor has made extensive and intensive studies with a view toward developing a method for obtaining a photocured resin product in which not only does a relief portion have a different color from the color of a non-relief portion, but also the contrast due to the color difference is stably maintained. As a result, it has been found that when an anthraquinone dye capable of exhibiting a color change to produce a fresh color upon being irradiated with an ultraviolet ray of a wavelength in the range of from 300 to 400 nm and of a quantity of larger than a threshold value in the presence of a radical producer capable of producing a free radical upon being irradiated with an ultraviolet ray having a wavelength in the range of from 300 to 400 nm, is incorporated into a photosensitive resin composition containing a radical producer and the photosensitive resin composition is irradiated with an ultraviolet ray of a quantity of larger than a threshold value through a negative mask having a transparent pattern, a photocured resin product is obtained having, formed therein, an image portion and a non-image portion which are different in color from each other and wherein the contrast between these portions due to the color difference is stably maintained. The present invention has been completed based on this finding.

DISCLOSURE OF THE INVENTION

Accordingly, it is an object of the present invention to provide a novel photosensitive resin composition which, upon being irradiated with an ultraviolet ray through a negative mask having a transparent pattern, is capable of producing a photocured resin product having, formed therein, an image portion and a non-image portion which are different in color from each other and wherein the contrast between these portions due to the color difference is stably maintained.

It is another object of the present invention to provide a photosensitive element structure having a photosensitive layer comprised of the above-mentioned photosensitive resin composition.

The foregoing and other objects, features and advantages of the present invention will be apparent to those skilled in the art from the following detailed description and appended claims.

Essentially, according to the present invention, there is provided a photosensitive resin composition comprising:

(A) at least one polymer selected from the group consisting of a binder polymer, a prepolymer and a mixture thereof;

(B) an ethylenically unsaturated compound;

(C) a radical producer capable of producing a free radical upon being irradiated with an ultraviolet ray having a wavelength in the range of from 300 to 400 nm; and (D) an anthraquinone dye capable of exhibiting a color change to produce a fresh color upon being irradiated with an ultraviolet ray having a wavelength in the range of from 300 to 400 nm in the presence of the radical producer (C).

The anthraquinone dye used in the present invention (hereinafter frequently referred to as "photo-color-changeable dye") which is capable of exhibiting a color change to produce a fresh color upon being irradiated with a ray, is capable of exhibiting a color change to produce a fresh color upon being irradiated with an ultraviolet ray of a quantity of larger than a threshold value, to thereby provide a contrasting color difference between an exposed portion and an unexposed portion of a photosensitive resin composition. Accordingly, in the case where the photosensitive resin composition of the present invention is used for preparing a flexographic printing plate, when the photosensitive resin composition of the present invention is irradiated with an ultraviolet ray of a quantity of larger than a threshold value through a negative mask having a transparent pattern, a formed relief portion corresponding to the exposed portion is caused to have a color which is different from the color of a formed non-image portion corresponding to the unexposed portion, so that a flexographic printing plate can be obtained which is good in contrast (hereinafter frequently referred to as "contrast of a plate face") between the relief portion and the non-image portion and, hence, is greatly improved in working efficiency and accuracy for positioning when the printing plate is mounted onto the cylinder of a printing machine.

In the present invention, the terminology "color change to produce a fresh color" exhibited by an anthraquinone dye is defined as an appearance of a new absorption peak in a 400 to 700 nm wavelength range of a visible absorption spectrum of the dye at a position distant by at least 40 nm, preferably 60 nm, more preferably 80 nm, from the absorption peak of the dye in an original state.

A printing plate can be prepared from the photosensitive resin composition of the present invention by the following manner. First, a substrate film optionally having an adhesive layer formed on its upper surface, a photosensitive resin composition and a cover sheet optionally having on its lower surface a protective polymer layer being soluble or dispersible in a solvent capable of dissolving or dispersing an uncured photosensitive resin composition are disposed in this order to thereby prepare a photosensitive element structure. The thus prepared photosensitive element structure is then subjected to processing for preparing a printing plate.

Generally, preparation of a printing plate from the photosensitive element structure is performed according to a process comprising uniform exposure (back exposure) over the substrate side, relief exposure, washing out of an uncured portion of the resin composition, drying, surface treatment for removing a surface tack and post-exposure. Therefore, a light quantity as a threshold value which is necessary for a photo-color-changeable dye contained in the photosensitive resin composition to exhibit a color change to produce a fresh color only at a portion corresponding to a relief portion, is not only required to be greater than the sum of the light quantities given to the relief portion by the other exposures than the relief exposure, namely, the sum of the light quantities of the back exposure and post-exposure, but also required to be not greater than the sum of the light quantities given to the relief portion by all of the exposures, including the back exposure, relief exposure, post-exposure and the like. When the photo-color-changeable dye exhibits a color change at a light quantity which is not greater than the sum of the light quantities of the other exposures than the relief exposure, the non-image portion is caused to have the same type of color as the relief portion, so that the desired good contrast of a plate face cannot be obtained. On the other hand, when it needs a light quantity which is greater than the sum of the light quantities of all of the exposures for a photo-color-changeable dye to exhibit a color change to produce a fresh color, the relief portion cannot exhibit any color change, so that a good contrast of a plate face cannot be obtained.

The anthraquinone dye used in the present invention, which is capable of exhibiting a color change to produce a fresh color upon being irradiated with an ultraviolet ray of a wavelength in the range of from 300 to 400 nm in the presence of a radical producer capable of producing a free radical upon being irradiated with an ultraviolet ray having a wavelength in the range of from 300 to 400 nm, satisfies the above-mentioned conditions with respect to the relationship between the threshold light quantity value for exhibiting a color change upon being irradiating with an ultraviolet ray of a wavelength in the range of from 300 to 400 nm and the light quantity necessary for photocuring a photosensitive resin composition which is generally used for preparing a flexographic printing plate. A minimum light quantity (threshold value) required for exhibiting a color change can be changed by selecting the type and amount of a radical producer used in the photosensitive resin composition. The larger the amount of a radical producer, the smaller the light quantity required for exhibiting a color change. Thus, it is necessary to select the concentration of a dye and the concentration of a radical producer, taking into consideration the balance among the photo-color-change characteristics of a dye relative to the light quantity, the photosensitivity of the photosensitive resin composition, etc.

As described above, the anthraquinone dye used in the present invention is not particularly limited as long as the dye is capable of exhibiting a color change to produce a fresh color upon being irradiated with an ultraviolet ray of a wavelength in the range of from 300 to 400 nm in the presence of a radical producer which is capable of producing a free radical upon being irradiated with an ultraviolet ray having a wavelength in the range of from 300 to 400 nm. Examples of such dyes, which have an anthraquinone skeleton, include OPLAS VIOLET 730 which is also known by the Color Index No. C.I. Solvent Violet 13

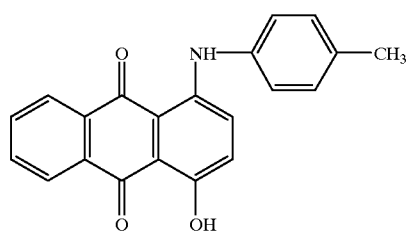

OPLAS BLUE 2N , which is also known by the Color Index No. C.I. Solvent Blue 35

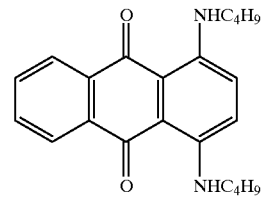

manufactured by Orient Chemical Co., Ltd., Japan); DIARESIN BLUE G

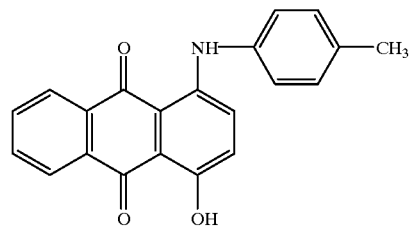

and DIARESIN BLUE J (color index no. C.I. Solvent Violet 33, manufactured by Mitsubishi Chemical Industries Ltd., JAPAN); KAYASET GREEN A-G (manufactured by Nippon Kayaku Co., Ltd., JAPAN); and the like. The anthraquinone dye is not limited to these examples.

Of various anthraquinone dyes, most suitable is a compound represented by the following formula (III), e.g., KAYASET GREEN A-G, or a derivative thereof wherein a benzene ring in Formula (III ) below is substituted with an alkyl group having 1 to 4 carbon atoms:

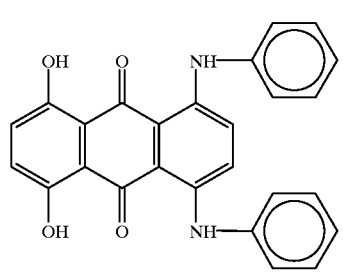

(III)

The photo-color-changeable dye employed in the present invention is incorporated in an amount of from 0.001 to 2% by weight, preferably from 0.005 to 0.2% by weight, based on the weight of the photosensitive resin composition. When the amount is less than 0.001% by weight, a satisfactory contrast of a plate face cannot be obtained. On the other hand, when the amount is more than 2% by weight, the photopolymerization rate of the photosensitive resin composition becomes too low due to an increase in ultraviolet-ray absorption by the dye, thus rendering it difficult to practically use the photosensitive resin composition.

In the present invention, as polymer component (A), there can be employed, individually or in combination, conventional binder polymers having no polymerizable double bond in the molecule and conventional prepolymers having a polymerizable double bond in the molecule.

Examples of binder polymers include crystalline 1,2-polybutadiene, an acrylonitrile-butadiene copolymer, and thermoplastic block copolymers, such as a polystyrenepolybutadiene-polystyrene block copolymer and a polystyrene-polyisoprene-polystyrene block copolymer.

These binder polymers are disclosed in publications, such as Japanese Patent Application Laid-Open Specification No. 47-37521 (corresponding to U.S. Pat. No. 4,323,637), Japanese Patent Application Laid-Open Specification No. 51-106501 (corresponding to U.S. Pat. No. 4,045,231), Japanese Patent Application Laid-Open Specification No. 52-64301 (corresponding to British Patent No. 1552653), Japanese Patent Application Laid-Open Specification No. 53-127004 (corresponding to U.S. Pat. No. 4,197,130), Japanese Patent Application Laid-Open Specification No. 54-110287 (corresponding to U.S. Pat. No. 4,177,074), Japanese Patent Application Laid-Open Specification No. 55-48744 (corresponding to U.S. Pat. No. 4,266,005) and Japanese Patent Application Laid-Open Specification No. 58-62640 (corresponding to U.S. Pat. No. 4,446,220).

As the binder polymer, a thermoplastic block copolymer, which has very excellent cold-flow resistance in an uncured state and rubbery elasticity in a cured state, is preferably employed in the photosensitive resin composition of the present invention when the composition is used for producing a flexographic printing plate.

Examples of prepolymers include an unsaturated polyurethane and an unsaturated polyester which are modified at their respective terminals with acrylate or methacrylate groups. An unsaturated polyurethane can be prepared, for example, by reacting a diol compound with a diisocyanate compound, thereby obtaining a polymer having isocyanate groups or hydroxyl groups at both terminals thereof; and reacting the obtained polymer with a compound having both a functional group susceptive to addition reaction with these terminal groups and a polymerizable double bond. An unsaturated polyester can be prepared, for example, by subjecting a diol compound and a dicarboxylic acid compound to a dehydration-condensation reaction with each other, thereby obtaining a polymer having hydroxyl groups or carboxyl groups at both terminals thereof; and reacting the obtained polymer with a compound having both a functional group susceptive to addition reaction or condensation reaction with these terminal groups and a polymerizable double bond.

As the ethylenically unsaturated compound (B), those disclosed in the patent publications mentioned above in connection with component (A) can be employed. Illustratively stated, examples of ethylenically unsaturated compounds usable in the present invention include esters of acrylic acid, methacrylic acid and fumaric acid, maleic acid; derivatives of acrylamide and methacrylamide; allyl esters; and styrene and its derivatives. More specific examples of ethylenically unsaturated compounds include ethylene glycol diacrylate or dimethacrylate, diethylene glycol diacrylate or dimethacrylate, propylene glycol diacrylate or dimethacrylate, dipropylene glycol diacrylate or dimethacrylate, polyethylene glycol diacrylate or dimethacrylate, polypropylene glycol diacrylate or dimethacrylate, butylene glycol diacrylate or dimethacrylate; trimethylolpropane triacrylate or trimethacrylate, pentaerythritol tetraacrylate or tetramethacrylate; N,N'-hexamethylene bisacrylamide or methacrylamide, diacetone acrylamide or methacrylamide, styrene, vinyltoluene, divinylbenzene, diallyl phthalate, triallyl cyanurate, diethyl fumarate, dibutyl fumarate, dioctyl fumarate, distearyl fumarate, butyloctyl fumarate, diphenyl fumarate, dibenzyl fumarate, dibutyl maleate, dioctyl maleate, bis (3-phenylpropyl) fumarate, dilauryl fumarate and dibehenyl fumarate. The ethylenically unsaturated compound is not limited to these examples. These compounds may be employed individually or in combination.

As the radical producer capable of producing a free radical upon being irradiated with an ultraviolet ray having a wavelength in the range of from 300 to 400 nm, conventional compounds, such as those photopolymerization initiators which are disclosed in the above-mentioned patent publications, e.g., benzoin derivatives, such as 2,2-dimethoxy-2-phenylacetophenone, and the like can be employed. However, compounds respectively represented by the following formula (I) and formula (II) are preferably employed individually or in combination with each other or with other photopolymerization initiators from the viewpoint of obtaining a photocured resin product having a high contrast due to the color difference between an image portion and a non-image portion, since use of these compounds have an especially high effect on the color change:

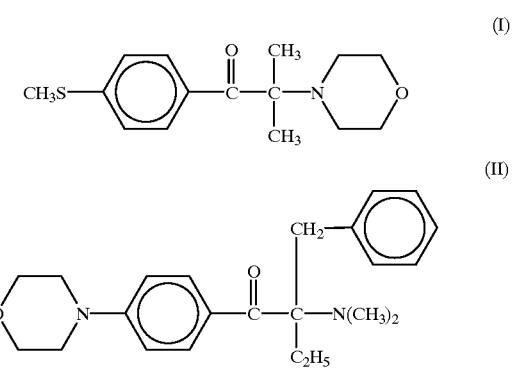

The other photopolymerization initiators usable in combination with these compounds are not particularly restricted.

Generally, a photopolymerization initiator as the radical producer capable of producing a free radical upon being irradiated with an ultraviolet ray of a wavelength in the range of from 300 to 400 nm is incorporated in an amount of 0.01 to 5% by weight, based on the weight of the photosensitive resin composition. A suitable amount of the radical producer is chosen depending on the type and amount of the photo-color-changeable dye so that not only can the photosensitive resin composition have a satisfactory photosensitivity but also the dye can exhibit a color change at a light quantity given for forming a relief portion. From such a viewpoint, a particularly preferred amount of the photopolymerization initiator is in the range of from 0.1 to 3% by weight.

A protective polymer layer which may be provided on the surface of a cover sheet used in the present invention comprises a polymer (hereinafter frequently referred to simply as "a soluble polymer") which is soluble or dispersible in a solvent capable of dissolving or dispersing an uncured photosensitive resin composition. It is necessary that the protective polymer layer be transparent and have no tackiness, and can be washed out with a developer after light exposure. Examples of polymers suitable for forming this protective polymer layer include soluble polyamide, and cellulose esters, such as cellulose acetate butylate and cellulose acetate propionate.

A solvent-soluble polymer layer can be provided on the surface of a cover sheet to thereby form a cover sheet composite. The cover sheet composite which can be employed in the present invention can be obtained by a method in which a solution which has been prepared by dissolving a soluble polymer in a solvent, is coated on a film made of a polyester and the like by gravure coating, reverse coating and the like, to thereby form a polymer layer. Generally, the solvent-soluble polymer layer has a thickness of 1 to 10 μm.

A substrate used in the present invention is a dimensionally stable film made of a polyester and the like, and is preferably coated with an adhesive of the type which is generally used in a flexographic printing plate.

Thus, the photosensitive resin composition of the present invention can be laminated onto a substrate film, a cover sheet and the like, to thereby form a photosensitive element structure for use in the production of various types of printing plates, photoresists and the like in which a good contrasting color difference between the image portion and the non-image portion is provided.

Accordingly, in another aspect of the present invention, there is provided a photosensitive element structure comprising a substrate film having, disposed thereon in the following order, a photosensitive layer and a cover sheet, the photosensitive layer being comprised of a photosensitive resin composition comprising:

(A) at least one polymer selected from the group consisting of a binder polymer, a prepolymer and a mixture thereof;

(B) an ethylenically unsaturated compound;

(C) a radical producer capable of producing a free radical upon being irradiated with an ultraviolet ray having a wavelength in the range of from 300 to 400 nm; and (D) an anthraquinone dye capable of exhibiting a color change to produce a fresh color upon being irradiated with an ultraviolet ray having a wavelength in the range of from 300 to 400 nm in the presence of the radical producer (C).

Preferred examples of methods for producing a photosensitive element structure for use in the production of a printing plate by the use of the photosensitive resin composition of the present invention, include a method in which a cover sheet composite prepared by laminating a soluble polymer layer by coating and the like to a cover sheet made of a polyester film and the like, a photosensitive resin composition containing a photo-color-changeable dye, and a substrate film having an adhesive layer are disposed one upon another so that the soluble polymer layer and the adhesive layer are in contact with the photosensitive resin composition and then, the resultant laminate is subjected to molding by pressing or calendering, thereby obtaining a photosensitive element structure. The cover sheet can be easily peeled off from the thus obtained photosensitive element structure before being subjected to light exposure.

Alternatively, there may be employed a method in which a photosensitive resin composition in a molten state is laminated to a substrate film having an adhesive layer or to a cover sheet composite by T-die extrusion and then a cover sheet composite or a substrate film is laminated thereto, followed by calendering.

With respect to the order of the above-mentioned back exposure and relief exposure, it is not necessary to perform back exposure first. Relief exposure may be performed first, or both exposures may be performed simultaneously. Further, back exposure is not essential and can be omitted. Generally, however, from the viewpoint of obtaining a stable relief, it is preferred to perform back exposure and, in this instance, to perform back exposure before relief exposure as mentioned above. When back exposure is performed, it is necessary that the substrate film be transparent to actinic rays.

The production of a flexographic printing plate from the photosensitive resin composition of the present invention can be conducted, for example, by the following method. There is provided a laminate structure (photosensitive element structure) comprised of a substrate film which may or may not have an adhesive layer, a photosensitive resin composition, and a cover sheet which may or may not have a polymer layer (soluble polymer layer) which is soluble or dispersible in a solvent capable of dissolving or dispersing an uncured photosensitive resin. Then, the cover sheet is peeled off from the laminate structure while leaving the soluble polymer layer as it is. Next, back exposure is conducted over the substrate side [Step (a)] to cure the entire surface of the substrate side of the photosensitive resin composition and, further, an image bearing transparency, such as a negative film is closely disposed on the soluble polymer layer [Step (b)], followed by relief exposure through the image bearing transparency. In this instance, Steps (a) and (b) may be conducted in the reverse order. Further, an unexposed, uncured portion is washed out from the cured composition layer with a developing solution (for example, chlorine-containing solvents, such as tetrachloroethylene and 1,1,1-trichloroethane and mixtures thereof with an alcohol), to effect development, thereby obtaining a relief printing plate. The thus obtained printing plate is washed and dried and then, subjected to post-exposure. The post-exposure may be conducted in water, and in such a case, the drying can be carried out after the post-exposure.

As a light source to be used for back exposure, relief exposure and post-exposure, there can be employed a light source capable of emitting an ultraviolet ray having a wavelength in the range of from 300 to 400 nm, e.g., a chemical lamp or high pressure mercury lamp having a central wavelength in the range of from 360 to 370 nm. Light source intensity varies depending on the distance between a photosensitive element structure and a light source, but is usually in the range of from 1 to 15 mw/cm$^2$.

Back exposure is conducted with a light quantity in the range of from 0 to 1,500 mj/cm$^2$ according to the thickness to which the back surface is to be cured.

Relief exposure is conducted with a light quantity in the range of from 3,000 to 14,000 mj/cm$^2$ according to the fineness of an image to be obtained.

Post-exposure is conducted with a light quantity in the range of up to 1,500 mj/cm$^2$.

To remove the surface tack of the obtained plate, ultraviolet rays having a wavelength of 300 nm or less may be irradiated from a germicidal lamp. An ultraviolet ray having such a short wavelength does not have any effect on the desired color change of the dye used in the photosensitive resin composition of the present invention and, hence, can be irradiated over the surface of the plate in a quantity necessary for removing surface tack.

BEST MODE FOR CARRYING OUT THE INVENTION

Hereinbelow, the present invention will be illustrated with reference to Examples, which however should not be construed as limiting the present invention.

EXAMPLE 1

A 10% by weight toluene/ethanol (weight ratio: 80/20) solution of cellulose acetate butyrate (CAB-551-0.1 manufactured and sold by Kodak, U.S.A.) was prepared, and coated on a 100 μ-thick polyester film by a bar coating method so that a coated layer having a thickness of 5μ was obtained after drying. Thus, a cover sheet composite having a soluble polymer layer was obtained.

3 kg of a polystyrene-polybutadiene-polystyrene block copolymer (styrene content: 40%, melt index (MI) under G conditions in accordance with ASTM D1238: 12) as a binder polymer, 500 g of dioctyl fumarate, 200 g of polypropylene glycol diacrylate, 90 g of 2,2-dimethoxy-2-phenyl acetophenone, 9 g of 2,6-di-t-butyl-p-cresol and 0.5 g of anthraquinone dye KAYASET GREEN A-G (manufactured and sold by Nippon Kayaku Co., Japan) were kneaded in a kneader, thereby obtaining a photosensitive resin composition.

The above-mentioned kneaded photosensitive resin composition was sandwiched between a 100 μ-thick polyester film having a urethane adhesive layer and the cover sheet composite so that the photosensitive resin was in contact with the adhesive layer of the polyester film and the cellulose derivative layer of the cover sheet composite. The resultant laminate was subjected to molding in a pressing machine by pre-heating at 150° C. for 4 minutes and then pressing under 100 kg/cm$^2$ for 4 minutes, using a 3 mm-thick spacer.

From the thus obtained photosensitive element structure, the polyester film remote from the substrate was stripped off to expose the cellulose derivative layer. A negative film was pressed onto the exposed cellulose derivative layer on an AFP-1500 light exposure machine (manufactured and sold by Asahi Kasei Kogyo K.K., Japan) and then, a back exposure was conducted from the substrate side at 750 mj/cm$^2$, followed by imagewise exposure (relief exposure) through the negative film at 8000 mj/cm$^2$. After the exposures, only a portion of the photocured resin plate which corresponded to a relief portion had undergone a color change from green into blue. These exposures were conducted under the following conditions by means of a chemical lamp having a central wavelength at 370 nm.

Back exposure: 150 seconds at a light source intensity of 5 mW/cm$^2$.

Imagewise exposure: 16 minutes and 40 seconds at a light source intensity of 8 mW/cm$^2$.

Then, the photocured resin plate was subjected to development by using a developer comprised of tetrachloroethylene/butanol (volume ratio: 3/1), and dried at 60° C. for 1 hour, followed by post exposure at 1000 mj/cm$^2$ using the same light source as employed for the imagewise exposure. Further, the plate was irradiated with rays from a germicidal lamp at 1500 mj/cm$^2$ to remove the surface tack. Thus, a flexographic printing plate was obtained.

In the thus obtained printing plate, only the surface portion of the relief had undergone a color change into blue while allowing the non-image portion to remain unchanged light green, thereby providing a high contrast between the relief portion and the non-image portion. Due to the high contrast, in mounting the printing plate onto the cylinder of a printing machine, the positioning of the printing plate was able to be readily conducted.

EXAMPLE 2 AND COMPARATIVE EXAMPLE 1

Photosensitive resin composition sheets were individually obtained in substantially the same manner as in Example 1 except that the types and the amounts of the radical producer and the photo-color-changeable dye were varied. From the thus obtained sheets, flexographic printing plates were obtained in the same manner as in Example 1. Results obtained are shown in the table below. With respect to the plates of Run Nos. 1 to 7 shown in the table below, the positioning of the plate in mounting onto the cylinder of a printing machine was able to be readily conducted. By contrast, with respect to the plate of Comparative Example 1, which was obtained without using a photo-color-changeable dye, it was difficult to distinguish the relief portion from the other portion, so that not only was the positioning not easy, but also the accuracy of the positioning was low. Results are shown in Table 1.

TABLE 1

| | Photo-color-changeable dye | Radical producer (*) | Color contrast in the obtained plates |
|---|---|---|---|
| 1 | KAYASET GREEN A-G 0.005% | A: 2% C: 0.1% | non-image portion: green image portion: deeply dark blue |
| 2 | KAYASET GREEN A-G 0.02% | A: 1% B: 0.2% | non-image portion: green image portion: deeply dark blue |
| 3 | KAYASET GREEN A-G 0.1% | A: 0.5% B: 0.3% | non-image portion: green image portion: deeply dark blue |
| 4 | KAYASET GREEN A-G 0.02% | B: 1% | non-image portion: green image portion: deeply dark blue |
| 5 | OPLAS VIOLET 730 0.02% | A: 1% B: 0.1% | non-image portion: purple image portion: deeply dark blue |
| 6 | OPLAS BLUE 2N 0.03% | A: 1% B: 0.2% | non-image portion: blue image portion: purple |
| 7 | DIARESIN BLUE G 0.5% | A: 1% B: 0.2% | non-image portion: blue image portion: purple |
| Comparative Example 1 | — | A: 1% B: 0.2% | non-image portion: light yellow image portion: light yellow |

*Radical producer
A: 2,2-diimethoxy-2-phenylacetophenone
B: compound represented by the following formula (I)
C: compound represented by the following formula (II)

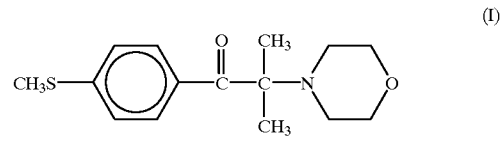

(I)

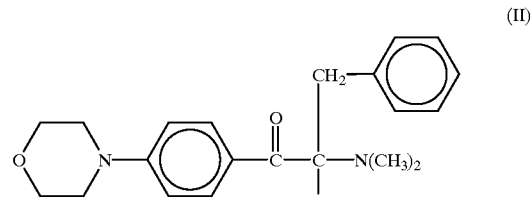

(II)

Comparative Example 2

A photosensitive element structure was obtained in substantially the same manner as described in Example 1 except that 0.5 g of SUMIPLASTBLUE-G (manufactured and sold by Sumitomo Chemical Co., Ltd., Japan), which is the same anthraquinone dye as used in Example 1 of Japanese Patent Application Laid-Open Specification No. 62-287234, was employed instead of the photo-color-changeable change dye. Next, the same subsequent plate making procedure as described in Example 1 was repeated to obtain a flexographic printing plate. The thus obtained plate had a blue color in its entirety. The flexographic printing plate, which had no color difference between the relief portion and the non-image portion, was low in the contrast of a plate face. Thus, when the printing plate was mounted onto the cylinder of a printing machine, the positioning of the printing plate was difficult.

Industrial Applicability

The photosensitive resin composition of the present invention contains an anthraquinone dye capable of exhibiting a color change to produce a fresh color upon being irradiated with an ultraviolet ray of a wavelength in the range of from 300 to 400 nm in the presence of a radical producer capable of producing a free radical upon being irradiated with an ultraviolet ray having a wavelength in the range of from 300 to 400 nm. When this composition is used, for example, in the production of a printing plate by irradiation through a negative mask having a predetermined transparent pattern with an ultraviolet ray of a wavelength in a specific range and of a quantity of larger than a threshold value, a relief portion and a non-image portion which are different in color from each other are formed, thereby enabling production of a flexographic printing plate which has a good contrast of a plate face. The obtained printing plate is greatly improved in working efficiency and accuracy for positioning when the printing plate is mounted onto the cylinder of a printing machine, as compared to the conventional printing plate comprising a relief portion and a non-image portion both having substantially the same color.

I claim:

1. A photosensitive element structure for producing a relief printing plate, comprising a substrate film having, disposed thereon in the following order, a photosensitive layer, a protective polymer layer and a cover sheet, said photosensitive layer being comprised of a photosensitive resin composition comprising:
(A) at least one polymer selected from the group consisting of a binder polymer having no polymerizable double bond in a molecule thereof, a prepolymer having a polymerizable double bond in a molecule thereof and a mixture thereof;
(B) an ethylenically unsaturated compound;
(C) a radical producer capable of producing a free radical upon being irradiated with an ultraviolet ray having a wavelength in the range of from 300 to 400 nm; and
(D) from 0.005 to 0.2% by weight, based on the weight of the photosensitive resin composition, of an anthraquinone dye capable of exhibiting a color change to produce a fresh color that is stably maintained upon being irradiated with an ultraviolet ray having a wavelength in the range of from 300 to 400 nm in the presence of said radical producer (C), and
said protective polymer layer being soluble or dispersible in a solvent capable of dissolving or dispersing the photosensitive resin composition of the photosensitive layer; wherein said dye (D) comprises a compound of formula (III):

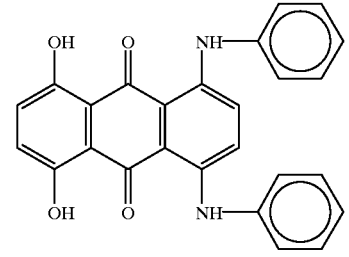

or a derivative of a compound of formula (III) having a benzene ring thereof substituted by a $C_{1-4}$ alkyl group.

2. The photosensitive element structure according to claim 1, wherein said polymer (A) is at least one binder polymer selected from the group consisting of crystalline 1,2-polybutadiene, an acrylonitrile-butadiene copolymer, and a thermoplastic block copolymer.

3. A photosensitive element structure for producing a relief printing plate, comprising a substrate film having, disposed thereon in the following order, a photosensitive layer, a protective polymer layer and a cover sheet, said photosensitive layer being comprised of a photosensitive resin composition comprising:
(A) at least one polymer selected from the group consisting of a binder polymer having no polymerizable double bond in a molecule thereof, a prepolymer having a polymerizable double bond in a molecule thereof and a mixture thereof;
(B) an ethylenically unsaturated compound;
(C) a radical producer capable of producing a free radical upon being irradiated with an ultraviolet ray having a wavelength in the range of from 300 to 400 nm; and
(D) from 0.001 to 2% by weight, based on the weight of the photosensitive resin composition, of an anthraquinone dye capable of exhibiting a color change to produce a fresh color that is stably maintained upon being irradiated with an ultraviolet ray having a wavelength in the range of from 300 to 400 nm in the presence of said radical producer (C), and
said protective polymer layer being soluble or dispersible in a solvent capable of dissolving or dispersing the photosensitive resin composition of the photosensitive layer; wherein said dye (D) comprises 1,4-bis (butylamino)-9,10-anthraquinone (Color Index No. C.I. Solvent Blue 35).

4. The photosensitive element structure according to claim 2, wherein said polymer (A) is at least one binder polymer selected from the group consisting of crystalline 1,2-polybutadiene, an acrylonitrile-butadiene copolymer, and a thermoplastic block copolymer.

5. A photosensitive element structure for producing a relief printing plate, comprising a substrate film having, disposed thereon in the following order, a photosensitive layer, a protective polymer layer and a cover sheet, said photosensitive layer being comprised of a photosensitive resin composition comprising:
(A) at least one polymer selected from the group consisting of a binder polymer having no polymer izable double bond in a molecule thereof, a prepolymer having a polymerizable double bond in a molecule thereof and a mixture thereof;

(B) an ethylenically unsaturated compound;

(C) a radical producer capable of producing a free radical upon being irradiated with an ultraviolet ray having a wavelength in the range of from 300 to 400 nm; and (D) from 0.005 to 0.2% by weight, based on the weight of the photosensitive resin composition, of an anthraquinone dye capable of exhibiting a color change to produce a fresh color that is stably maintained upon being irradiated with an ultraviolet ray having a wavelength in the range of from 300 to 400 nm in the presence of said radical producer (C), and said protective polymer layer being soluble or dispersible in a solvent capable of dissolving or dispersing the photosensitive resin composition of the photosensitive layer; wherein said dye (D) comprises 1-hydroxyl-4-(4-methylanilino)anthraquinone (Color Index No. C.I. Solvent Violet 13).

6. The photosensitive element structure according to claim 5, wherein said polymer (A) is at least one binder polymer selected from the group consisting of crystalline 1,2-polybutadiene, an acrylonitrile-butadiene copolymer, and a thermoplastic block copolymer.

* * * * *